US012317632B2

(12) United States Patent
Nakamura et al.

(10) Patent No.: US 12,317,632 B2
(45) Date of Patent: *May 27, 2025

(54) COATING DEVICE, COATING METHOD, AND METHOD FOR MANUFACTURING PHOTOCONDUCTOR FOR SUPPRESSING OCCURRENCE OF BUBBLE DEFECTS IN COATED FILM

(71) Applicant: FUJIFILM Business Innovation Corp., Tokyo (JP)

(72) Inventors: Akihiko Nakamura, Kanagawa (JP); Takaakira Sasaki, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 486 days.

This patent is subject to a terminal disclaimer.

(21) Appl. No.: 17/726,539

(22) Filed: Apr. 22, 2022

(65) Prior Publication Data

US 2022/0367746 A1 Nov. 17, 2022

(30) Foreign Application Priority Data

May 12, 2021 (JP) ................................. 2021-080892
Dec. 14, 2021 (JP) ................................. 2021-202692

(51) Int. Cl.
*B05D 1/18* (2006.01)
*B05C 3/109* (2006.01)
(Continued)

(52) U.S. Cl.
CPC ............. *H10F 71/00* (2025.01); *B05C 3/109* (2013.01); *B05C 13/02* (2013.01); *B05D 1/18* (2013.01);
(Continued)

(58) Field of Classification Search
CPC ...... G03G 5/0503; G03G 5/05; G03G 5/0525; B05D 1/18; B05D 1/26; B05D 2202/25;
(Continued)

(56) References Cited

U.S. PATENT DOCUMENTS 4,130,084 A * 12/1978 Hoelen ..................... G03F 7/18
118/59
5,616,365 A * 4/1997 Nealey ..................... B05D 1/18
427/430.1
(Continued)

FOREIGN PATENT DOCUMENTS

JP 2002045754 2/2002
JP 2002131945 A * 5/2002 ............... G03G 5/00
JP 2017187657 A * 10/2017 ............... G03G 5/00

*Primary Examiner* — Karl Kurple
(74) *Attorney, Agent, or Firm* — JCIPRNET

(57) ABSTRACT

A coating device includes: a coating liquid holding part that is provided with an upper opening portion and a lower opening portion and holds a coating liquid, and in which a cylindrical body penetrates the upper opening portion and the lower opening portion, and the cylindrical body is relatively moved to an upper side in an up-down direction, so that the coating liquid is applied to an outer peripheral surface of the cylindrical body; a container that accommodates the coating liquid that flows down; a circulation part that circulates the coating liquid in the container to the coating liquid holding part; and a receiving member that is disposed above a liquid level of the coating liquid in the container and receives the coating liquid flowing downward along the outer peripheral surface of the cylindrical body with an inclined surface.

18 Claims, 10 Drawing Sheets

(51) Int. Cl.

| | |
|---|---|
| ***B05C 13/02*** | (2006.01) |
| ***G03G 5/05*** | (2006.01) |
| ***H01L 21/67*** | (2006.01) |
| ***H10F 71/00*** | (2025.01) |

(52) U.S. Cl.
CPC ....... *G03G 5/0525* (2013.01); *H01L 21/6715* (2013.01)

(58) Field of Classification Search
CPC ............ B05D 2254/02; B05D 2254/04; Y10S 118/03; Y10S 118/10; B05C 3/09; B05C 3/109; B05C 3/10; B05C 3/18; B05C 3/20
USPC .................................................. 118/423, 429
See application file for complete search history.

(56) References Cited

U.S. PATENT DOCUMENTS

| | | | | |
|---|---|---|---|---|
| 5,693,372 | A * | 12/1997 | Mistrater | B05C 3/109 427/430.1 |
| 5,707,449 | A * | 1/1998 | Ohira | B05C 5/007 118/423 |
| 5,849,454 | A * | 12/1998 | Tada | B05C 3/12 427/430.1 |
| 6,214,419 | B1 * | 4/2001 | Dinh | B05D 1/18 427/430.1 |
| 6,428,857 | B1 * | 8/2002 | Swain | B05C 3/09 427/430.1 |
| 6,562,135 | B2 * | 5/2003 | Bush | B05D 1/18 118/407 |
| 6,797,330 | B1 * | 9/2004 | Bush | G03G 5/0525 118/406 |
| 2002/0104480 | A1 * | 8/2002 | Swain | B05C 3/109 118/422 |
| 2002/0144653 | A1 * | 10/2002 | Bush | B05C 3/09 427/430.1 |
| 2003/0012888 | A1 * | 1/2003 | Bonino | G03G 5/10 427/430.1 |
| 2016/0327878 | A1 * | 11/2016 | Cho | G03G 5/0525 |
| 2018/0373172 | A1 * | 12/2018 | Kitagawa | G03G 5/0525 |
| 2024/0310745 | A1 * | 9/2024 | Sasaki | G03G 5/0525 |

* cited by examiner

COATING DEVICE, COATING METHOD, AND METHOD FOR MANUFACTURING PHOTOCONDUCTOR FOR SUPPRESSING OCCURRENCE OF BUBBLE DEFECTS IN COATED FILM

CROSS-REFERENCE TO RELATED APPLICATIONS

This application is based on and claims priority under 35 USC 119 from Japanese Patent Application No. 2021-202692 filed Dec. 14, 2021 and No. 2021-080892 filed May 12, 2021.

BACKGROUND

(i) Technical Field

The present invention relates to a coating device, a coating method, and a method for manufacturing a photoconductor.

(ii) Related Art

JP2002-045754 discloses a coating device that applies a coating liquid to the outer surface of a cylindrical substrate by immersing the cylindrical substrate in the coating liquid in a state where the cylindrical substrate is held with a cylinder axis being almost vertical, and pulling up the cylindrical substrate from the coating liquid to the outside, the coating device including a coating tank which accommodates the coating liquid and in which the cylindrical substrate is immersed, and a coating liquid circulation mechanism which includes at least a defoaming tank that suppresses the occurrence of bubbles in the coating liquid, and a circulation tank that circulates the coating liquid to the coating tank, and in which the coating liquid is sent from a lower portion of the circulation tank to a lower portion of the coating tank by a pressure pump, overflows from an upper edge portion of the coating tank, is returned to the defoaming tank, and is sent from the lower portion of the defoaming tank into the coating liquid in the circulation tank, and the defoaming tank is provided with a coating liquid supply port.

SUMMARY

Aspects of non-limiting embodiments of the present disclosure relate to a coating device, a coating method, and a method for manufacturing a photoconductor, in which the occurrence of bubble defects in a coated film on the outer peripheral surface of a cylindrical body is suppressed compared to a case where a coating liquid flowing down along the outer peripheral surface of the cylindrical body falls to a liquid level of the coating liquid in a container.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a coating device including: a coating liquid holding part that is provided with an upper opening portion and a lower opening portion and holds a coating liquid, and in which a cylindrical body penetrates the upper opening portion and the lower opening portion, and the cylindrical body is relatively moved to an upper side in an up-down direction, so that the coating liquid is applied to an outer peripheral surface of the cylindrical body; a container that accommodates the coating liquid that flows down; a circulation part that circulates the coating liquid in the container to the coating liquid holding part; and a receiving member that is disposed above a liquid level of the coating liquid in the container and receives the coating liquid flowing downward along the outer peripheral surface of the cylindrical body with an inclined surface.

BRIEF DESCRIPTION OF THE DRAWINGS

Exemplary embodiment(s) of the present invention will be described in detail based on the following figures, wherein.

DETAILED DESCRIPTION

Figure 1:
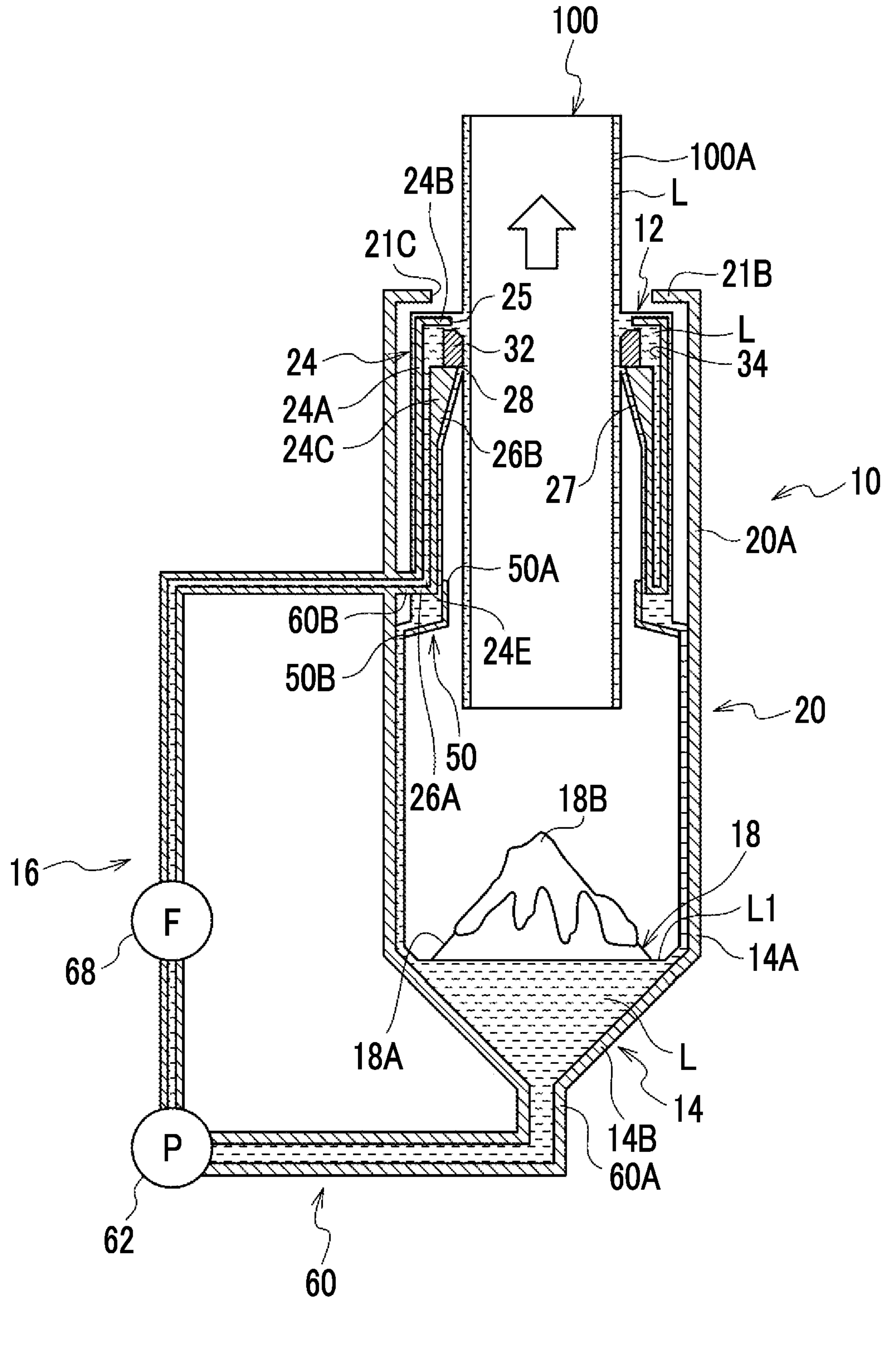
FIG. 1 is a cross-sectional view showing an outline of an overall configuration of a coating device according to a first exemplary embodiment.

Hereinafter, exemplary embodiments for carrying out the technique of the present disclosure will be described. In the following description, the direction indicated by an arrow UP appropriately shown in the drawings is defined as the upper side in an up-down direction of a device.

First Exemplary Embodiment

Overall Configuration of Coating Device

In FIG. 1, an example of a coating device 10 according to a first exemplary embodiment is shown in a cross-sectional view.

As shown in FIG. 1, the coating device 10 is a device for applying a coating liquid L to an outer peripheral surface 100A of a cylindrical body 100. The coating device 10 includes a coating liquid holding part 12 in which the coating liquid L is held, and a container 14 that accommodates the coating liquid L flowing down from the coating liquid holding part 12 side. Further, the coating device 10 includes a circulation part 16 that circulates the coating liquid L in the container 14 to the coating liquid holding part 12, and a receiving member 18 that receives the coating liquid L flowing down along the outer peripheral surface 100A of the cylindrical body 100. The coating device 10 includes a tubular housing 20. The coating liquid holding part 12 is supported on the upper portion side in the up-down direction in the housing 20. Further, the container 14 is provided at a lower portion in the up-down direction of the housing 20.

Cylindrical Body

The cylindrical body 100 is, for example, a cylindrical member made of metal or a member obtained by winding an endless belt-shaped member made of metal around a cylindrical core material. The cylindrical member or the endless belt-shaped member configuring the cylindrical body 100 is, for example, a photoconductor substrate or the like for an electrophotography. Further, for example, in a case where the photoconductor substrate for an electrophotography is used as the cylindrical body 100, a liquid containing a photosensitive material, or the like, is used as the coating liquid L. In the present exemplary embodiment, the coating liquid L is applied to the cylindrical member or the endless belt-shaped member configuring the cylindrical body 100 by the coating device 10. By using the liquid containing a photosensitive material as the coating liquid L, a photoconductor for an electrophotography can be manufactured.

Housing

As shown in FIG. 1, the housing 20 is configured with a cylindrical member, and is disposed such that an axial direction of the housing 20 is in the up-down direction.

As an example, for example, the housing 20 includes a cylindrical portion 20A disposed along the up-down direction.

An upper wall portion 21B extending inward in a radial direction is provided at the upper end portion of the cylindrical portion 20A, and a circular opening 21C is formed in the upper wall portion 21B. The inner diameter of the opening 21C is larger than the outer diameter of the cylindrical body 100. A configuration is made such that the cylindrical body 100 penetrates the opening 21C of the upper wall portion 21B in the axial direction.

Coating Liquid Holding Part

Figure 2:
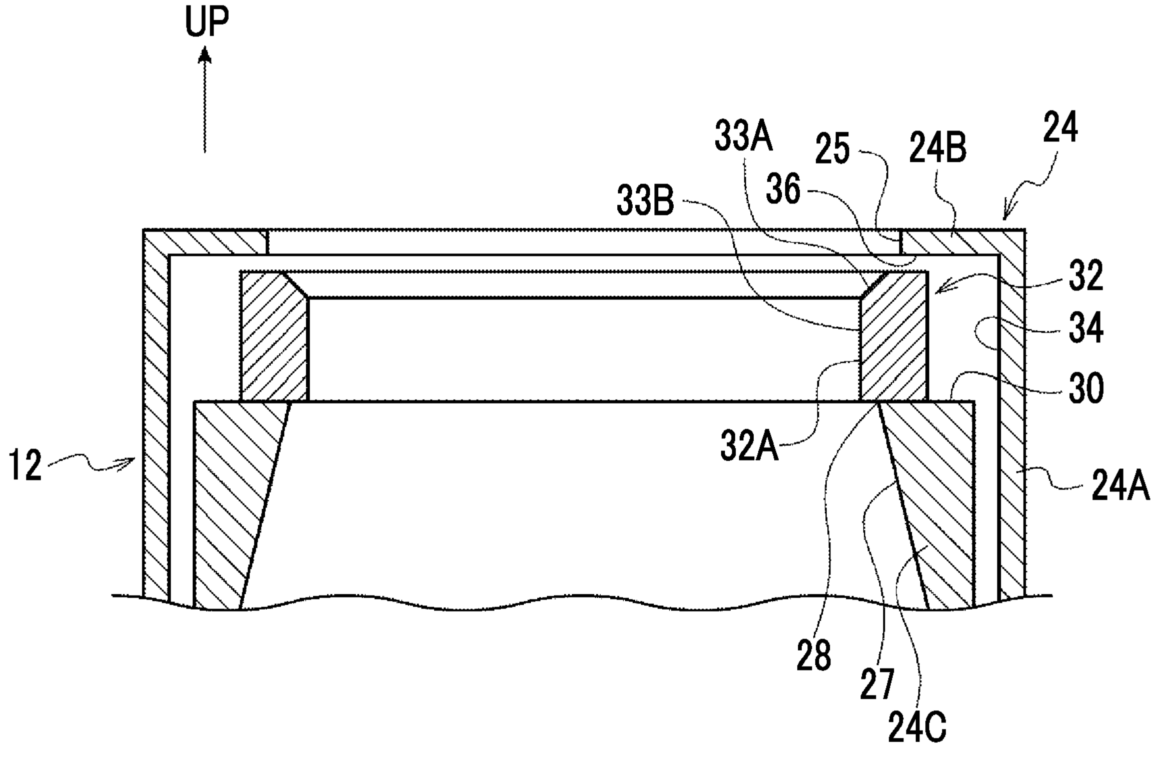
FIG. 2 is a cross-sectional view showing a part of a coating liquid holding part that is used in the coating device according to the first exemplary embodiment in an enlarged state.

As shown in FIGS. 1 and 2, the coating liquid holding part 12 has a tubular shape and has a function of discharging the coating liquid L inward in the radial direction. In this way, the coating liquid L is applied to the outer peripheral surface 100A of the cylindrical body 100 that is inserted into the coating liquid holding part 12. The coating liquid holding part 12 includes a case 24. The case 24 includes a cylindrical portion 24A, an upper wall portion 24B bent inward in the radial direction from an upper end portion of the cylindrical portion 24A, and a block portion 24C provided on the lower portion side of the cylindrical portion 24A.

An inflow port 24E into which the coating liquid L flows is provided at the lower portion on one side in the radial direction of the cylindrical portion 24A.

An upper opening portion 25 having a circular shape is provided in the upper wall portion 24B (refer to FIG. 2). The inner diameter of the upper opening portion 25 is larger than the outer diameter of the cylindrical body 100. A configuration is made such that the cylindrical body 100 penetrates the upper opening portion 25 of the upper wall portion 24B in the axial direction.

The block portion 24C includes a bottom wall portion 26A connected to the lower end portion of the cylindrical portion 24A, and a tubular inner side wall portion 26B extending upward from an inner end portion in the radial direction of the bottom wall portion 26A. An inclined portion 27 disposed to have an upward slope toward the inner side in the radial direction is formed on the upper portion side of the inner side wall portion 26B. A lower opening portion 28 having a circular shape is provided in the upper end portion of the inclined portion 27 of the inner side wall portion 26B. The inner diameter of the lower opening portion 28 is larger than the outer diameter of the cylindrical body 100. Further, the inner diameter of the lower opening portion 28 is smaller than the inner diameter of the upper opening portion 25. A configuration is made such that the cylindrical body 100 penetrates the lower opening portion 28 of the block portion 24C in the axial direction.

The coating liquid holding part 12 is supported on the upper portion side in the up-down direction inside the housing 20 by a supporting portion (not shown).

The case 24 includes the cylindrical portion 24A, the upper wall portion 24B, and the block portion 24C, so that the upper side of the block portion 24C is open inward in the radial direction. An annular body 32 is provided above the block portion 24C in the case 24. An installation surface 30 on which the annular body 32 is movably disposed is provided at the upper portion of the block portion 24C. The installation surface 30 has a planar shape and is disposed along the horizontal direction.

The annular body 32 is disposed in the open portion on the inner side in the radial direction of the case 24. The inner diameter of the annular body 32 is larger than the outer diameter of the cylindrical body 100. As an example, the inner diameter of the annular body 32 is smaller than the inner diameter of the lower opening portion 28. The inner peripheral surface 32A side of the annular body 32 is exposed to a region through which the cylindrical body 100 penetrates (refer to FIG. 2). A configuration is made such that the cylindrical body 100 penetrates the inside of the annular body 32 in the axial direction. As an example, the annular body 32 is disposed in a state where the coating liquid L is interposed between the annular body 32 and the installation surface 30. The annular body 32 is made to be movable (in the present exemplary embodiment, slidable) relative to the installation surface 30. In the present exemplary embodiment, a driving unit that directly drives the annular body 32 is not provided, and the annular body 32 is made to autonomously slide relative to the installation surface 30.

As an example, an inclined surface 33A that is disposed on the upper portion side and has a downward slope from the upper opening portion 25 side, and a straight portion 33B disposed straight along the up-down direction from a lower end portion of the inclined surface 33A are provided on the inner peripheral surface 32A of the annular body 32 (refer to FIG. 2).

A flow path 34 through which the coating liquid L flows is provided between the cylindrical portion 24A and the block portion 24C and between the cylindrical portion 24A and the annular body 32 inside the case 24. The end portion of the flow path 34 on the upstream side in a flow direction of the coating liquid L is connected to the inflow port 24E (refer to FIG. 1). The coating liquid holding part 12 is provided with a slit-shaped discharge portion 36 along the circumferential direction between the upper opening portion 25 of the upper wall portion 24B and the annular body 32, and the coating liquid L is discharged from the discharge portion 36 (refer to FIG. 2). That is, the discharge portion 36 faces the region of the coating liquid holding part 12, through which the cylindrical body 100 penetrates, and the coating liquid L is discharged toward the cylindrical body 100 side. The coating liquid L discharged from the discharge portion 36 overflows from the upper opening portion 25 toward the upper surface side of the upper wall portion 24B, and flows downward between the annular body 32 and the outer peripheral surface 100A of the cylindrical body 100.

Figure 4C:
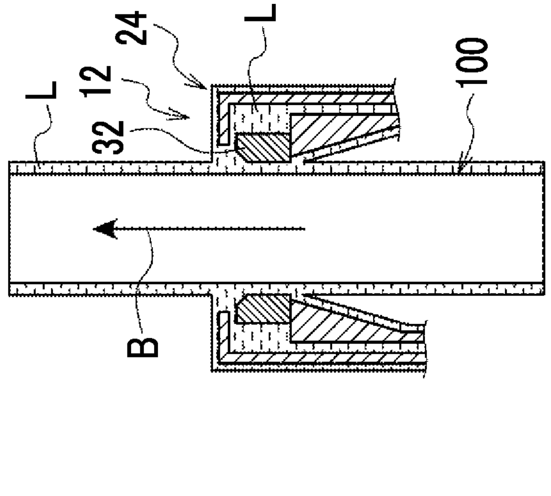
FIG. 4C is a configuration diagram showing a state where the cylindrical body is being moved upward in an up-down direction with respect to the coating liquid holding part.
Figure 4B:
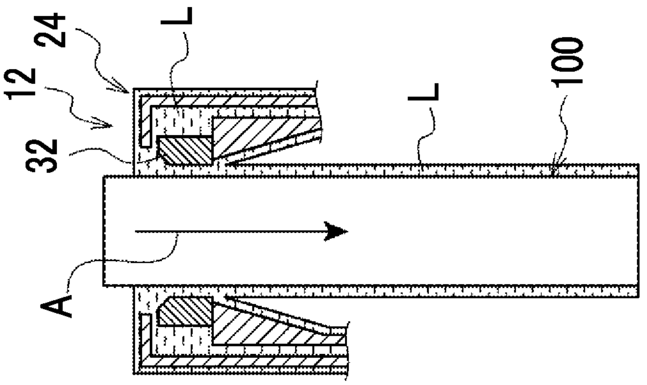
FIG. 4B is a configuration diagram showing a state where the cylindrical body is inserted into the coating liquid holding part of the coating device and lowered.

In this state, the coating liquid L is applied to the outer peripheral surface 100A of the cylindrical body 100 by moving the cylindrical body 100 to the upper side in the up-down direction relative to the coating liquid holding part 12 (refer to FIGS. 4B and 4C). In the coating liquid holding part 12, the coating liquid L flows between the outer peripheral surface 100A of the cylindrical body 100 and the inner peripheral surface 32A of the annular body 32, and the annular body 32 is movable relative to the installation surface 30 by the pressure due to the flow of the coating liquid L. At this time, the annular body 32 is movable relative to the installation surface 30 such that the gap between the outer peripheral surface 100A of the cylindrical body 100 and the inner peripheral surface 32A of the annular body 32 becomes uniform along the circumferential direction.

Figure 4A:
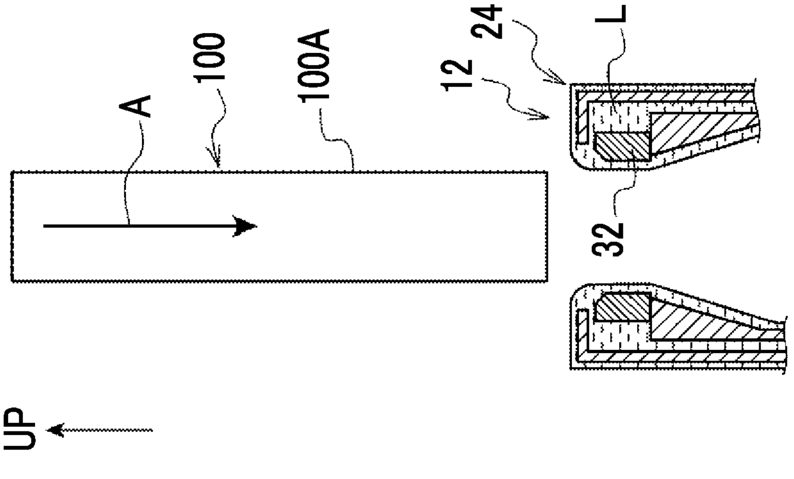
FIG. 4A is a configuration diagram showing a state before a cylindrical body is inserted into the coating liquid holding part of the coating device according to the first exemplary embodiment.

In FIGS. 4A to 4C, an example of a method of applying the coating liquid L to the outer peripheral surface 100A of the cylindrical body 100 by the coating liquid holding part 12 of the coating device 10 is shown. As shown in FIG. 4A, the cylindrical body 100 is inserted along the axial direction from the upper side of the coating liquid holding part 12, and the cylindrical body 100 is moved downward (in a direction of an arrow A). As shown in FIG. 4B, the cylindrical body 100 is further lowered in the direction of the arrow A, and the coating liquid L is supplied to the coating liquid holding part 12 by the circulation part 16 (refer to FIG. 1), so that the coating liquid L is filled between the annular body 32 of the coating liquid holding part 12 and the outer peripheral surface 100A of the cylindrical body 100. Then, the cylindrical body 100 reaches the lowermost portion, so that the upper end portion in the axial direction of the cylindrical body 100 is disposed at a position facing the coating liquid holding part 12.

Thereafter, as shown in FIG. 4C, the cylindrical body 100 is moved upward (in a direction of an arrow B) with respect to the coating liquid holding part 12. At this time, the coating liquid L is discharged from the discharge portion 36 such that the coating liquid L overflows from the upper side. In this way, the coating liquid L flows out downward from the lower opening portion 28, and the coating liquid L is applied to the outer peripheral surface 100A of the cylindrical body 100 located above the upper opening portion 25, so that a coated film 102 is formed on the outer peripheral surface 100A of the cylindrical body 100 (refer to FIG. 5B). FIGS. 4A to 4C show an example of the method of applying the coating liquid L to the outer peripheral surface 100A of the cylindrical body 100, and the coating method can be changed.

Figure 5A:
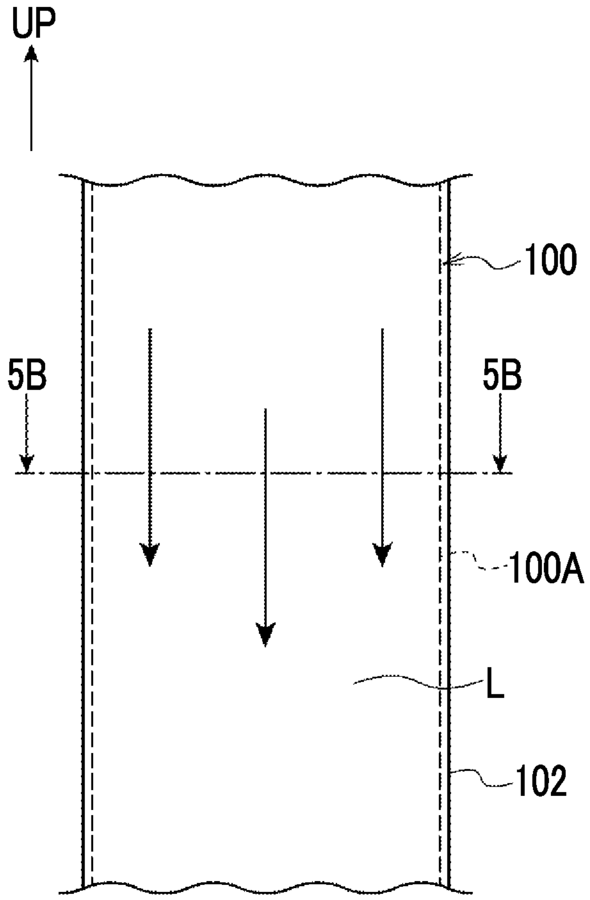
FIG. 5A is a side view showing a part of the cylindrical body in which a coated film by a coating liquid is formed on an outer peripheral surface of the cylindrical body.
Figure 5B:
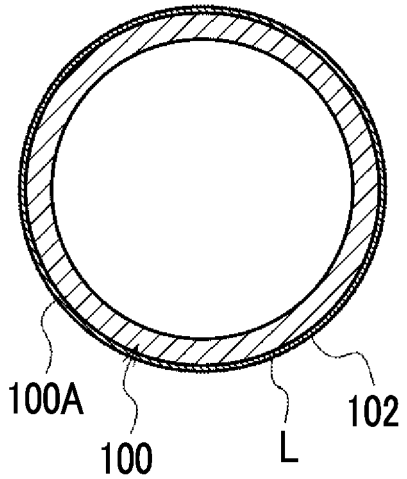
FIG. 5B is a sectional view taken along line 5B-5B in FIG. 5A.

As shown in FIG. 5A, in the process in which the coating liquid L is applied to the outer peripheral surface 100A of the cylindrical body 100, the coating liquid L applied to the outer peripheral surface 100A of the cylindrical body 100 flows downward along the outer peripheral surface 100A of the cylindrical body 100.

Further, as shown in FIG. 1, in the coating device 10, a wall portion 50 is provided on the lower side of the coating liquid holding part 12 inside the housing 20. An opening portion 50A through which the cylindrical body 100 penetrates is provided at the wall portion 50. Further, a hole portion 50B disposed at a position adjacent to the inner wall surface of the housing 20 is provided at the lower end portion in the diagonal direction of the wall portion 50. In this way, the coating liquid L flows down from the hole portion 50B of the wall portion 50 along the inner wall surface of the housing 20, and the coating liquid L is collected in the container 14.

Container

As shown in FIG. 1, the container 14 is connected to the lower end portion of the cylindrical portion 20A of the housing 20. The container 14 includes a cylindrical portion 14A connected to the cylindrical portion 20A, and a recess portion 14B disposed at the lower portion of the cylindrical portion 14A and having a valley-shaped bottom surface. In the present exemplary embodiment, the bottom surface of the recess portion 14B has an inverted conical shape in which the inner diameter gradually decreases toward the lower side.

The recess portion 14B has a bottom surface inclined to have a downward slope from the cylindrical portion 14A side toward the central portion in the radial direction, and the central portion of the recess portion 14B is the lowermost portion. The coating liquid L flowing down from the coating liquid holding part 12 side is collected in the recess portion 14B of the container 14. As an example, a liquid level L1 of the coating liquid L is located on the upper portion side of the recess portion 14B.

Receiving Member

Figure 3:
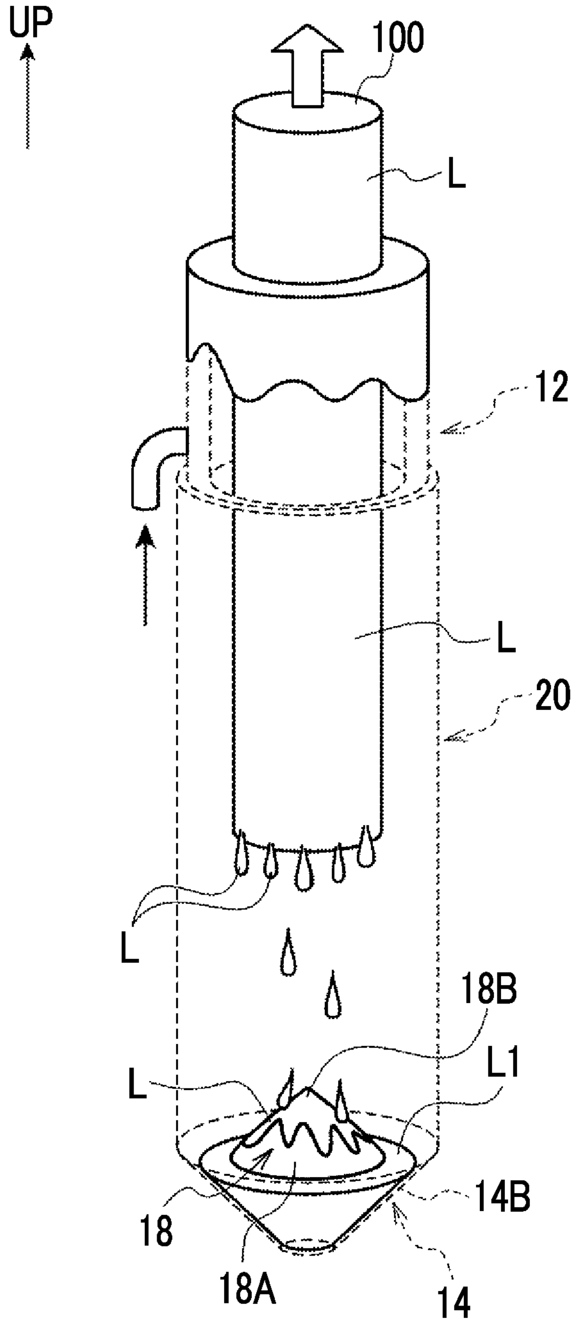
FIG. 3 is a perspective view showing configurations of a receiving member receiving a coating liquid and a container, which are used in the coating device according to the first exemplary embodiment.

As shown in FIGS. 1 and 3, the receiving member 18 is provided in the container 14. The receiving member 18 has a conical shape whose central portion protrudes upward in the up-down direction. More specifically, the receiving member 18 includes an inclined surface 18A having an ascending slope from the side of the recess portion 14B toward the central portion in the radial direction, and a top portion 18B formed at an upper end portion of the inclined surface 18A. The width of the largest portion of the receiving member 18 in the direction orthogonal to the axial direction of the receiving member 18 is larger than the outer diameter of the cylindrical body 100. In this way, the receiving member 18 is configured to receive the coating liquid L flowing downward along the outer peripheral surface 100A of the cylindrical body 100 with the inclined surface 18A. In the present exemplary embodiment, the portion of the inclined surface 18A that receives the coating liquid L is disposed above the liquid level L1 of the coating liquid L in the container 14. Therefore, the coating liquid L flowing downward along the outer peripheral surface 100A of the cylindrical body 100 does not directly fall to the liquid level L1 of the coating liquid L.

Figure 6:
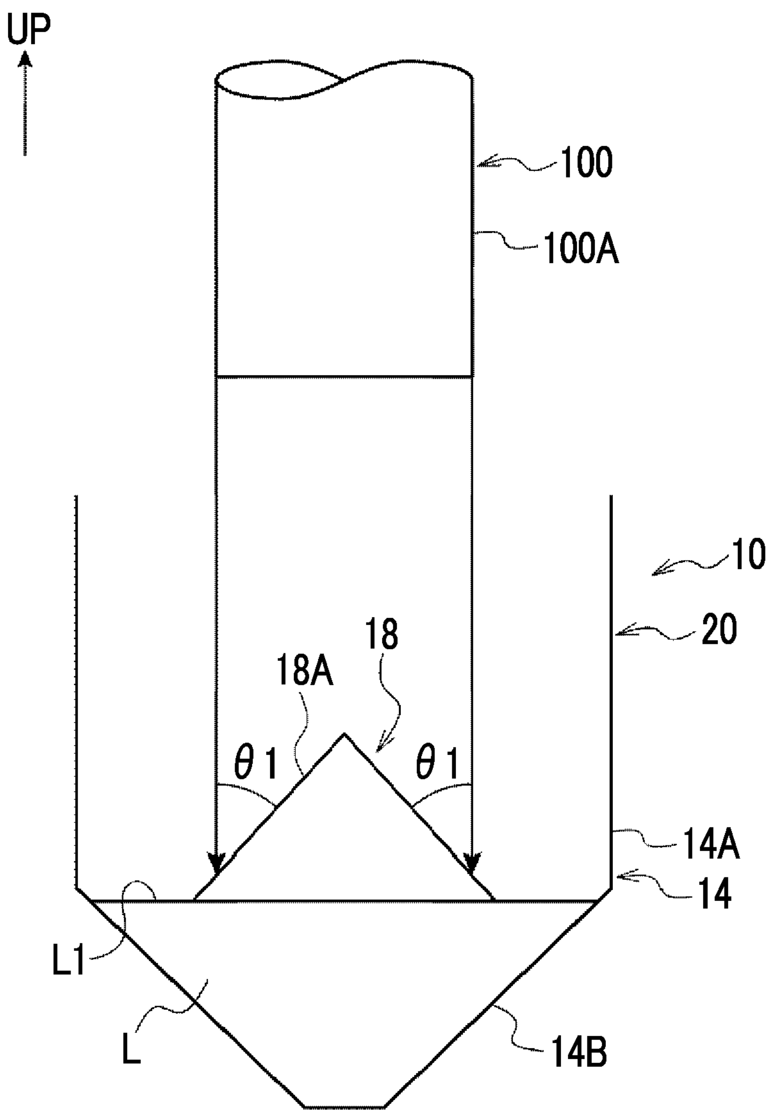
FIG. 6 is a side view showing the receiving member that is used in the coating device according to the first exemplary embodiment in an enlarged state.

In the present exemplary embodiment, as shown in FIG. 6, the inclined surface 18A has a straight line shape in a case of being viewed from the direction orthogonal to the axial direction of the coating liquid holding part 12 (that is, in a case of being viewed in a side view). As an example, the inclined surface 18A of the receiving member 18 is symmetrical in the right-left direction shown in FIG. 6. An angle θ1 of the inclined surface 18A with respect to the vertical direction preferably greater than or equal to 10° and less than or equal to 60°, more preferably greater than or equal to 12° and less than or equal to 52° or smaller, and further preferably greater than or equal to 15° and less than or equal to 45°, for example. For example, the angle θ1 of the inclined surface 18A with respect to the vertical direction is set to 45°.

Circulation Part

As shown in FIG. 1, the circulation part 16 includes a supply pipe 60 for supplying the coating liquid L in the container 14 to the coating liquid holding part 12, and a pump 62 provided in the middle of the supply pipe 60. The pump 62 transfers the coating liquid L in the supply pipe 60 from the container 14 side to the coating liquid holding part 12 side.

An upstream-side end portion 60A in the flow direction of the coating liquid L of the supply pipe 60 is connected to the lower portion of the container 14. In the present exemplary embodiment, the upstream-side end portion 60A of the supply pipe 60 is connected to the central portion which is the lowermost portion of the recess portion 14B. Further, a downstream-side end portion 60B in the flow direction of the coating liquid L of the supply pipe 60 penetrates the housing 20 and is connected to the inflow port 24E of the coating liquid holding part 12. In this way, the coating liquid L flowing through the supply pipe 60 is supplied to the flow path 34 from the inflow port 24E. There is a case where the upstream side or the downstream side in the flow direction of the coating liquid L is simply referred to as the "upstream side" or the "downstream side" with the expression "the flow direction of the coating liquid L" omitted.

Further, a filter 68 for removing foreign matter contained in the coating liquid L is provided on the downstream side of the pump 62 in the flow direction of the coating liquid L in the middle of the supply pipe 60.

In the coating device 10, the coating liquid L in the container 14 is supplied to the coating liquid holding part 12 through the supply pipe 60 by driving the pump 62 of the circulation part 16. In the coating liquid holding part 12, the coating liquid L is applied to the outer peripheral surface 100A of the cylindrical body 100, and the coating liquid L flowing down along the outer peripheral surface 100A of the cylindrical body 100 falls to the inclined surface 18A of the receiving member 18 and flows down on the inclined surface 18A to be collected in the container 14. Then, the coating liquid L in the container 14 is supplied to the coating liquid holding part 12 through the supply pipe 60. Therefore, the coating liquid L in the container 14 is circulated to the coating liquid holding part 12 by the circulation part 16.

Operation and Effect

Next, the operation and effect of the present exemplary embodiment will be described.

The coating device 10 includes the coating liquid holding part 12 which is provided with the upper opening portion 25 and the lower opening portion 28 and holds the coating liquid L. In the coating liquid holding part 12, the cylindrical body 100 penetrates the upper opening portion 25 and the lower opening portion 28, and the cylindrical body 100 is relatively moved upward in the up-down direction, so that the coating liquid L is applied to the outer peripheral surface 100A of the cylindrical body 100.

More specifically, as shown in FIG. 4A, the cylindrical body 100 is inserted in the direction of the arrow A from the upper side of the coating liquid holding part 12. As shown in FIG. 4B, the cylindrical body 100 is lowered in the direction of the arrow A, and the coating liquid L is supplied to the coating liquid holding part 12 by the circulation part 16 (refer to FIG. 1), so that the coating liquid L is filled between the annular body 32 of the coating liquid holding part 12 and the outer peripheral surface 100A of the cylindrical body 100. Then, the cylindrical body 100 reaches the lowermost portion.

Thereafter, as shown in FIG. 4C, the cylindrical body 100 is moved upward (in the direction of the arrow B) with respect to the coating liquid holding part 12, and the coating liquid L is discharged from the discharge portion 36 such that the coating liquid L overflows from the upper side. In this way, the coating liquid L flows out downward from the lower opening portion 28, and the coating liquid L is applied to the outer peripheral surface 100A of the cylindrical body 100 located above the upper opening portion 25. In this way, the coated film 102 is formed on the outer peripheral surface 100A of the cylindrical body 100 (refer to FIG. 5B).

The coating device 10 is provided with the container 14 that accommodates the coating liquid L flowing down from the coating liquid holding part 12 side, and the receiving member 18 that receives the coating liquid L flowing downward along the outer peripheral surface 100A of the cylindrical body 100 with the inclined surface 18A. The portion of the inclined surface 18A of the receiving member 18 that receives the coating liquid L is disposed above the liquid level L1 of the coating liquid L in the container 14. In this way, the coating liquid L flowing downward along the outer peripheral surface 100A of the cylindrical body 100 is received by the inclined surface 18A, and the coating liquid L flows down along the inclined surface 18A, so that the coating liquid L is collected in the container 14 (refer to FIG. 3).

Further, the coating device 10 includes the circulation part 16 that circulates the coating liquid L in the container 14 to the coating liquid holding part 12. In the circulation part 16, the coating liquid L in the container 14 is supplied to the coating liquid holding part 12 through the supply pipe 60 by driving the pump 62.

In the coating device 10 described above, the coating liquid L flowing downward along the outer peripheral surface 100A of the cylindrical body 100 is received by the inclined surface 18A of the receiving member 18. Then, since the coating liquid L flowing down along the inclined surface 18A merges with the liquid level L1 of the coating liquid L in the container 14, the coating liquid L is difficult to foam. In this way, in the coating device 10, the coating liquid L in the container 14 is difficult to foam, compared to a case where the coating liquid flowing down along the outer peripheral surface of the cylindrical body falls to the liquid level of the coating liquid in the container. Therefore, when the coating liquid L in the container 14 is supplied to the coating liquid holding part 12 through the supply pipe 60 by the circulation part 16, inclusion of bubbles in the coating liquid L is reduced. Therefore, in the coating device 10, the occurrence of bubble defects in the coated film 102 of the outer peripheral surface 100A of the cylindrical body 100 is suppressed compared to a case where the coating liquid flowing down along the outer peripheral surface of the cylindrical body falls to the liquid level of the coating liquid in the container.

Figure 10:
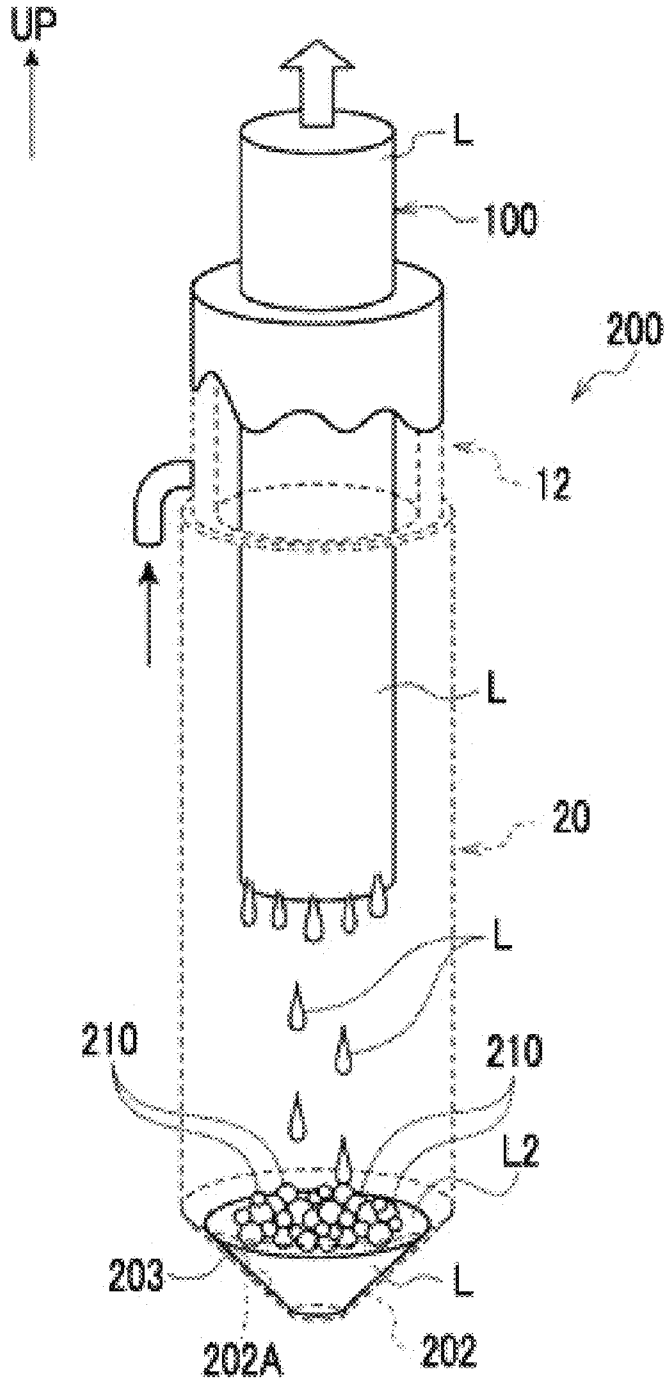
FIG. 10 is a schematic perspective view showing a configuration of a container of a coating device according to a comparative example.

In FIG. 10, a coating device 200 of a comparative example is shown. As shown in FIG. 10, in the coating device 200, a container 202 that accommodates the coating liquid L is provided at the lower part of the housing 20. The container 202 includes a concave portion 202A formed in an inverted conical shape. More specifically, the concave portion 202A is provided with an inclined surface 203 formed such that the inner diameter thereof gradually decreases toward the lower portion side, and the central portion is located at the lowest position. That is, the concave portion 202A has a shape in which the inclined surface 203 is recessed in a valley shape. A liquid level L2 of the coating liquid L accumulated in the concave portion 202A is located on the upper portion side of the concave portion 202A. The container 202 is not provided with the receiving member as in the first exemplary embodiment.

In the coating device 200, the coating liquid L that has flowed down along the outer peripheral surface 100A of the cylindrical body 100 falls to the liquid level L2 of the coating liquid L accumulated in the container 202. That is, a configuration is made such that the coating liquid L that has flowed down along the outer peripheral surface 100A of the cylindrical body 100 does not directly fall to the inclined surface 203. At this time, the coating liquid L tends to foam due to the impact when the fallen droplets of the coating liquid L hit the liquid level L2 of the coating liquid L. In this way, bubbles 210 are generated near the liquid level L2 of the coating liquid L. Therefore, when the coating liquid L in the container 202 is supplied to the coating liquid holding part by the circulation part, there is a case where bubbles are included in the coating liquid L.

In contrast, in the coating dvic 10 of the first exemplary embodiment, the coating liquid L flowing downward along the outer peripheral surface 100A of the cylindrical body 100 is received by the inclined surface 18A of the receiving member 18, and flows down on the inclined surface 18A to be collected in the container 14. In this way, the impact when the coating liquid L flowing down on the inclined surface 18A merges with the coating liquid L in the container 14 is alleviated, and bubbles are difficult to be generated in the coating liquid L in the container 14. Therefore, in the coating device 10, the occurrence of bubble defects in the coated film 102 of the outer peripheral surface 100A of the cylindrical body 100 is suppressed compared to a case where the coating liquid L flowing down along the outer peripheral surface 100A of the cylindrical body 100 falls to the liquid level L2 of the coating liquid L in the container 202.

Further, in the coating device 10, the inclined surface 18A has a straight linear shape in a case of being viewed from the direction orthogonal to the axial direction of the coating liquid holding part 12, and the angle θ1 of the inclined surface 18A with respect to the vertical direction is greater than or equal to 10° and less than or equal to 60°. Therefore, in the coating device 10, foaming due to the impact when the coating liquid L is received by the receiving member 18 is suppressed compared to a case where the angle of the inclined surface with respect to the vertical direction is smaller than 10°. Further, foaming when the coating liquid L received by the receiving member 18 merges with the liquid level L1 of the coating liquid L in the container 14 is suppressed compared to a case where the angle of the inclined surface with respect to the vertical direction is larger than 60°.

Further, in the coating device 10, the angle θ1 of the inclined surface 18A with respect to the vertical direction is greater than or equal to 15° and less than or equal to 45°. Therefore, in the coating device 10, foaming due to the impact when the coating liquid L is received by the receiving member 18 is suppressed compared to a case where the angle of the inclined surface with respect to the vertical direction is smaller than 15°. Further, foaming when the coating liquid L received by the receiving member 18 merges with the liquid level L1 of the coating liquid L in the container 14 is suppressed compared to a case where the angle of the inclined surface with respect to the vertical direction is larger than 45°.

Further, in the coating device 10, the inclined surface 18A has a conical shape whose central portion protrudes in a case of being viewed in a side view. Therefore, in the coating device 10, the coating liquid L falling from the outer peripheral surface 100A of the cylindrical body 100 is difficult to come into contact with the liquid level L1 of the coating liquid L in the container 14, compared to a case where the inclined surface has a shape recessed in a valley shape.

Further, a coating method of applying a coating liquid by using the coating device 10 includes moving the cylindrical body 100 upward in the up-down direction relative to the coating liquid holding part 12 and applying the coating liquid L from the coating liquid holding part 12 to the outer peripheral surface 100A of the cylindrical body 100. Further, the coating method includes receiving the coating liquid L flowing downward along the outer peripheral surface 100A of the cylindrical body 100 with the inclined surface 18A of the receiving member 18 above the liquid level L1 of the coating liquid L in the container 14 and accommodating the coating liquid L in the container 14. Further, the coating method includes circulating the coating liquid L in the container 14 to the coating liquid holding part 12 by the circulation part 16. Therefore, in the coating method, the occurrence of bubble defects in the coated film 102 on the outer peripheral surface 100A of the cylindrical body 100 is suppressed compared to a case where the coating liquid flowing down along the outer peripheral surface of the cylindrical body falls to the liquid level of the coating liquid in the container.

Further, in the coating method of applying the coating liquid by using the coating device 10, the cylindrical body 100 is a cylindrical member or a member obtained by winding an endless belt-shaped member around a cylindrical core material. Therefore, in the coating method, the occurrence of bubble defects in the coated film 102 of the outer peripheral surface 100A of the cylindrical member or the endless belt-shaped member is suppressed compared to a case where the coating liquid flowing down along the outer peripheral surface of the cylindrical body falls to the liquid level of the coating liquid in the container.

Further, in a method for manufacturing a photoconductor by using the coating method described above, the cylindrical body 100 is a cylindrical member made of metal or a member obtained by winding an endless belt-shaped member made of metal around a cylindrical core material, and the coating liquid L contains a photosensitive material. Therefore, in the method for manufacturing a photoconductor, the occurrence of bubble defects in the coated film 102 of the outer peripheral surface 100A of the photoconductor is suppressed compared to a case where the coating liquid flowing down along the outer peripheral surface of the cylindrical body falls to the liquid level of the coating liquid in the container.

Second Exemplary Embodiment

Next, a coating device 120 of a second exemplary embodiment will be described using FIG. 7. The identical components to the configurations of the first exemplary embodiment described above will be denoted the identical reference numerals and the description thereof will be omitted.

Figure 7:
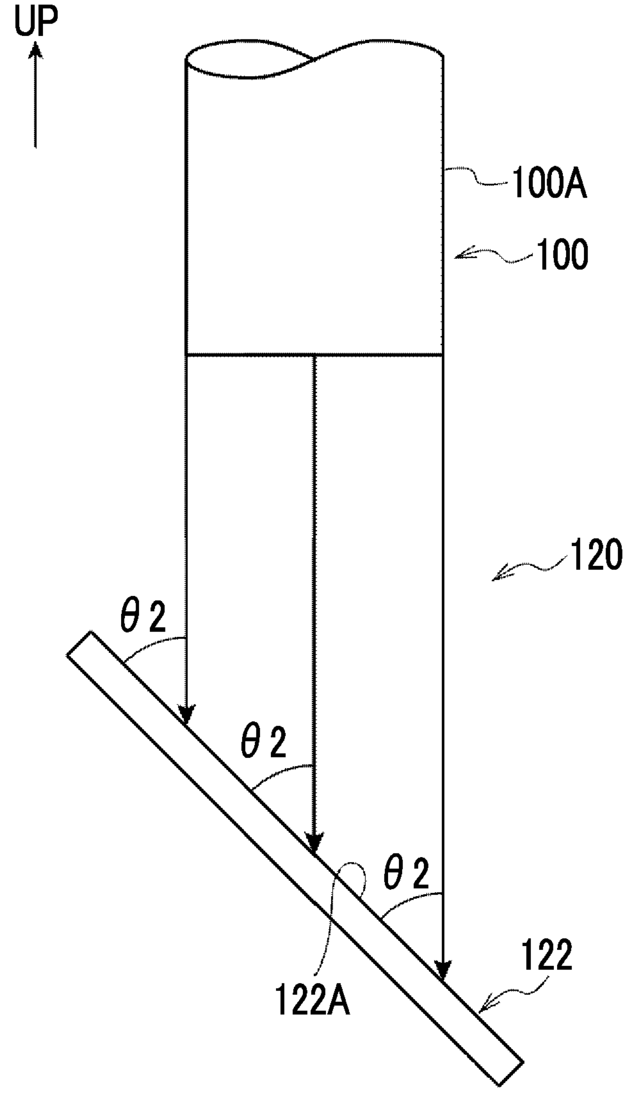
FIG. 7 is a side view showing a receiving member that is used in a coating device according to a second exemplary embodiment in an enlarged state.

As shown in FIG. 7, the coating device 120 includes a receiving member 122 instead of the receiving member 18 of the coating device 10 of the first exemplary embodiment. The receiving member 122 has a flat plate shape, and has, on the upper surface thereof, an inclined surface 122A that intersects the vertical direction. The inclined surface 122A is inclined to have a downward slope in one direction intersecting the vertical direction. In a state where the receiving member 122 is disposed, the width of the receiving member 122 in the direction orthogonal to the vertical direction is larger than the outer diameter of the cylindrical body 100. In this way, the receiving member 122 is configured to receive the coating liquid L flowing downward along the outer peripheral surface 100A of the cylindrical body 100 with the inclined surface 122A.

An angle θ2 of the inclined surface 122A with respect to the vertical direction is preferably greater than or equal to 10° and less than or equal to 60°, more preferably greater than or equal to 12° and less than or equal to 52°, and further preferably greater than or equal to 15° and less than or equal to 45°, for example. For example, the angle θ2 of the inclined surface 122A with respect to the vertical direction is set to 45°. Other configurations of the coating device 120 are the same as the configurations of the coating device 10 of the first exemplary embodiment.

In the coating device 120 described above, the same operation and effect can be obtained with the same configuration as the coating device 10 of the first exemplary embodiment.

Further, in the coating device 120, the inclined surface 122A is inclined to have a downward slope in one direction intersecting the vertical direction. Therefore, in the coating device 120, the structure of the receiving member 122 becomes simple, compared to a case where the inclined surface is inclined in a plurality of directions intersecting the vertical direction.

Third Exemplary Embodiment

Next, a coating device 130 of a third exemplary embodiment will be described using FIG. 8. The identical components to the configurations of the first and second exemplary embodiments described above will be denoted the identical reference numerals and the description thereof will be omitted.

Figure 8:
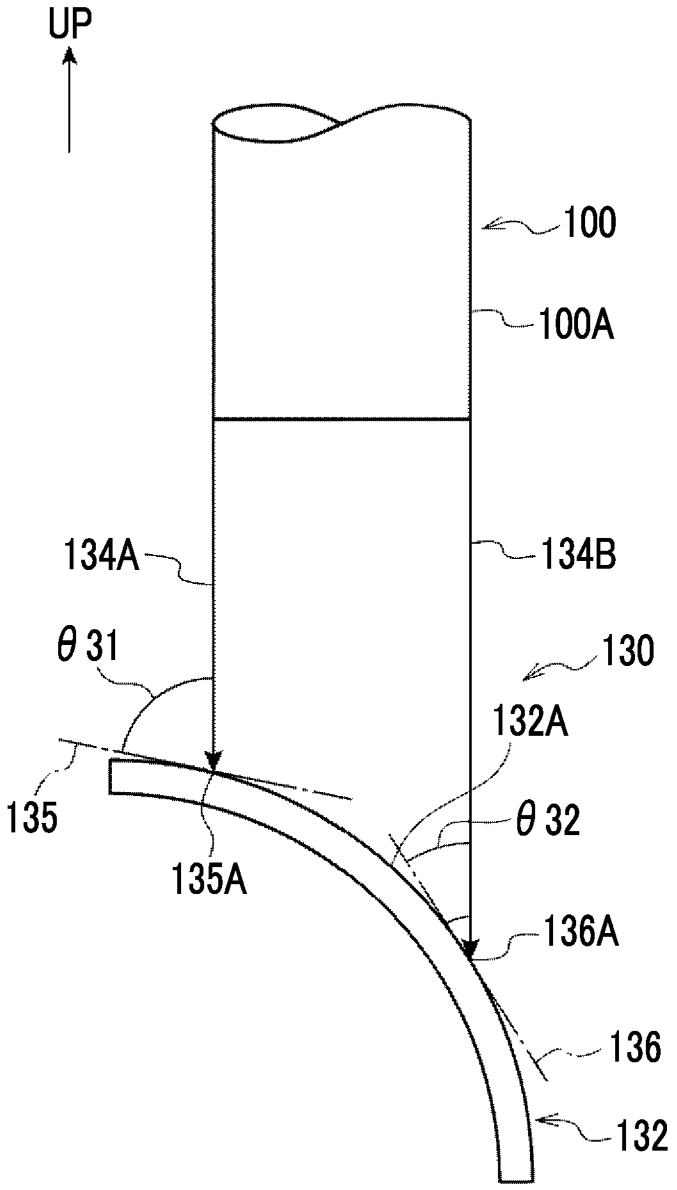
FIG. 8 is a side view showing a receiving member that is used in a coating device according to a third exemplary embodiment in an enlarged state.

As shown in FIG. 8, the coating device 130 includes a receiving member 132 instead of the receiving member 18 of the coating device 10 of the first exemplary embodiment. The receiving member 132 is a curved plate-shaped body and has an inclined surface 132A on the upper surface thereof. The inclined surface 132A is an example of a curved surface. In the present exemplary embodiment, the inclined surface 132A is a curved surface formed to be convex upward. In a state where the receiving member 132 is disposed, the width of the receiving member 132 in the direction orthogonal to the vertical direction is larger than the outer diameter of the cylindrical body 100. In this way, the receiving member 132 is configured to receive the coating liquid L flowing downward along the outer peripheral surface 100A of the cylindrical body 100 with the inclined surface 132A.

For example, a virtual tangent surface 135 at an intersection point 135A of the inclined surface 132A with one extension line 134A extending downward along the outer peripheral surface 100A of the cylindrical body 100 is depicted. Further, a virtual tangent surface 136 at an intersection point 136A of the inclined surface 132A with one extension line 134B extending downward along the outer peripheral surface 100A of the cylindrical body 100 is depicted. The tangent surfaces 135 and 136 shown in FIG. 8 are synonymous with tangent lines in the cross section. At this time, an angle θ31 between the tangent surface 135 and the vertical direction and an angle θ32 between the tangent surface 136 and the vertical direction are preferably greater than or equal to 10° and less than or equal to 60°, more preferably greater than or equal to 12° and less than or equal to 52°, and further preferably greater than or equal to 15° or larger and less than or equal to 45°, for example. For example, the angle θ31 between the tangent surface 135 and the vertical direction is set to 60°, and the angle θ32 between the tangent surface 136 and the vertical direction is set to 30°. Other configurations of the coating device 130 are the same as the configurations of the coating device 10 of the first exemplary embodiment.

In the coating device 130 described above, the same operation and effect can be obtained with the same configuration as the coating device 10 of the first exemplary embodiment.

Further, in the coating device 130, the angle θ31 between the tangent surface 135 and the vertical direction and the angle θ32 between the tangent surface 136 and the vertical direction are greater than or equal to 10° and less than or equal to 60°. Therefore, in the coating device 130, foaming due to the impact when the coating liquid L is received by the receiving member 132 is suppressed compared to a case where the angle θ31 between the tangent surface 135 and the vertical direction and the angle θ32 between the tangent surface 136 and the vertical direction are smaller than 10°. Further, foaming when the coating liquid L received by the receiving member 132 merges with the liquid level L1 of the coating liquid L in the container 14 is suppressed compared to a case where the angle θ31 between the tangent surface 135 and the vertical direction and the angle θ32 between the tangent surface 136 and the vertical direction are larger than 60°.

Further, although not shown in the drawing, in the coating device 130, the angle θ31 between the tangent surface 135 and the vertical direction and the angle θ32 between the tangent surface 136 and the vertical direction is preferably greater than or equal to 15° and less than or equal to 45°, for example. In this case, in the coating device 130, foaming due to the impact when the coating liquid L is received by the receiving member 132 is suppressed compared to a case where the angle θ31 between the tangent surface 135 and the vertical direction and the angle θ32 between the tangent surface 136 and the vertical direction are smaller than 15°. Further, foaming when the coating liquid L received by the receiving member 132 merges with the liquid level L1 of the coating liquid L in the container 14 is suppressed compared to a case where the angle θ31 between the tangent surface 135 and the vertical direction and the angle θ32 between the tangent surface 136 and the vertical direction are larger than 45°.

Fourth Exemplary Embodiment

Next, a coating device 140 of a fourth exemplary embodiment will be described using FIG. 9. The identical components to the configurations of the first to third exemplary embodiments described above will be denoted the identical reference numerals and the description thereof will be omitted.

Figure 9:
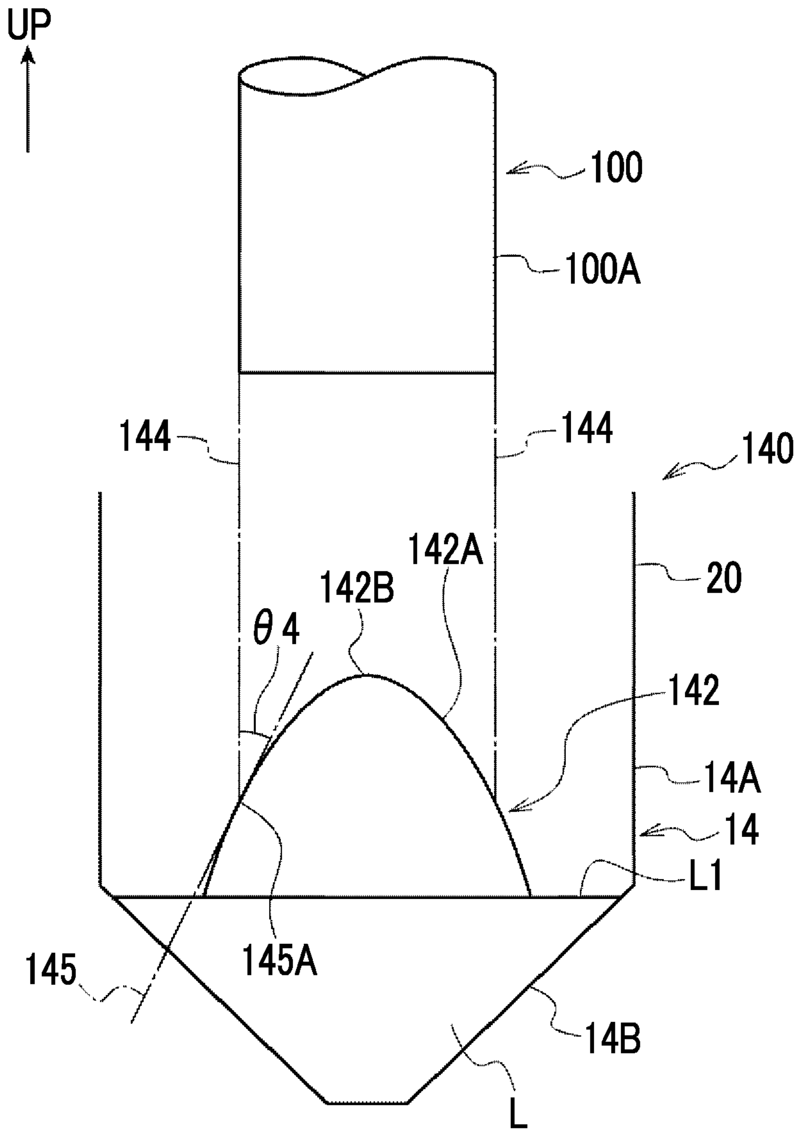
FIG. 9 is a side view showing a receiving member that is used in a coating device according to a fourth exemplary embodiment in an enlarged state.

As shown in FIG. 9, the coating device 140 includes a receiving member 142 instead of the receiving member 18 of the coating device 10 of the first exemplary embodiment. The receiving member 142 includes an inclined surface 142A that is a curved surface portion whose central portion projects in a mountain shape in a case of being viewed in a side view orthogonal to the axial direction of the container 14. The receiving member 142 is provided with an apex 142B, which is the uppermost portion of the curved surface portion, at the central portion of the inclined surface 142A.

The width of the receiving member 142 in the direction orthogonal to the vertical direction is larger than the outer diameter of the cylindrical body 100. In this way, the receiving member 142 is configured to receive the coating liquid L flowing downward along the outer peripheral surface 100A of the cylindrical body 100 with the inclined surface 142A.

For example, a virtual tangent surface 145 at an intersection point 145A of the inclined surface 142A with an extension line 144 extending downward along the outer peripheral surface 100A of the cylindrical body 100 is depicted. The tangent surface 145 is synonymous with a tangent line in the cross section. At this time, an angle θ4 between the tangent surface 145 and the vertical direction is preferably greater than or equal to 10° and less than or equal to 60°, more preferably greater than or equal to 12° and less than or equal to 52°, and further preferably greater than or equal to 15° and less than or equal to 45°, for example. For example, the angle θ4 between the tangent surface 145 and the vertical direction is set to 20°. Other configurations of the coating device 140 are the same as the configurations of the coating device 10 of the first exemplary embodiment.

In the coating device 140 described above, the same operation and effect can be obtained with the same configuration as the coating device 10 of the first exemplary embodiment.

Further, in the coating device 140, the inclined surface 142A is a curved surface portion whose central portion protrudes in a mountain shape in a case of being viewed in a side view. Therefore, in the coating device 140, the coating liquid L falling from the outer peripheral surface 100A of the cylindrical body 100 is difficult to come into contact with the liquid level L1 of the coating liquid L in the container 14, compared to a case where the inclined surface has a shape recessed in a valley shape.

Further, in the coating device 140, the angle θ4 between the tangent surface 145 and the vertical direction is greater than or equal to 10° and less than or equal to 60°. Therefore, in the coating device 140, foaming due to the impact when the coating liquid L is received by the receiving member 142 is suppressed compared to a case where the angle θ4 between the tangent surface 145 and the vertical direction is smaller than 10°. Further, foaming when the coating liquid L received by the receiving member 142 merges with the liquid level L1 of the coating liquid L in the container 14 is suppressed compared to a case where the angle between the tangent surface 145 and the vertical direction is larger than 60°.

Further, in the coating device 140, the angle θ4 between the tangent surface 145 and the vertical direction is greater than or equal to 15° and less than or equal to 45°. In the coating device 140, foaming due to the impact when the coating liquid L is received by the receiving member 142 is suppressed compared to a case where the angle θ4 between the tangent surface 145 and the vertical direction is smaller than 15°. Further, foaming when the coating liquid L received by the receiving member 142 merges with the liquid level L1 of the coating liquid L in the container 14 is suppressed compared to a case where the angle θ4 between the tangent surface 145 and the vertical direction is larger than 45°.

Supplementary Description

In the first to fourth exemplary embodiments, the shape of the receiving member can be changed as long as the shape is a shape in which the coating liquid L that has fallen from the outer peripheral surface 100A of the cylindrical body 100 is received by the inclined surface of the receiving member above the liquid level of the coating liquid in the container.

In the first to fourth exemplary embodiments, the configuration of each member of the coating liquid holding part 12 can be changed as long as the configuration is a configuration capable of applying the coating liquid L to the outer peripheral surface 100A of the cylindrical body 100. Further, the shape of the annular body 32 can also be changed.

Although the present invention has been described in detail based on the exemplary embodiments, the present invention is not limited to such exemplary embodiments, and it will be apparent to the persons skilled in the art that various other embodiments are possible within the scope of the present invention.

EXAMPLES

Hereinafter, the coating device and the coating method of the present disclosure will be more specifically described by way of examples. However, the coating device and the coating method of the present disclosure are not limited to the following examples as long as the gist is not exceeded.

Example 1

Preparation of Coating Liquid

The coating liquid L for forming a charge transport layer is prepared by dissolving 2.6 parts by mass of benzidine compound represented by Formula (CT-1) shown by Chemical formula 1 below and 3 parts by mass of polymer compound (viscosity average molecular weight: 40,000) having a repeating unit represented by Formula (B-1) shown by Chemical formula 2 below in 25 parts by mass of tetrahydrofuran. The coating liquid L is a liquid containing a photosensitive material for manufacturing a photoconductor for an electrophotography.

(CT-1)

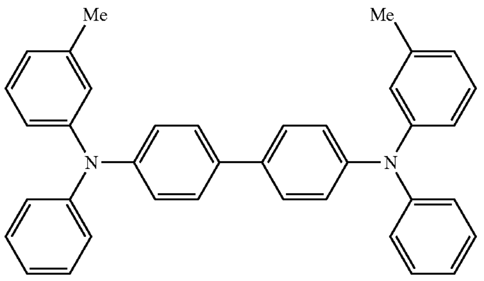

-continued (B-1)

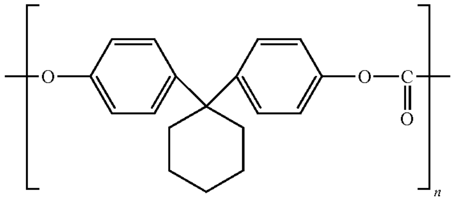

Application

Application of the coating liquid L to the cylindrical body 100 is performed using an aluminum pipe having ϕ84×340 mm as the cylindrical body 100 and using the coating device 10 shown in FIG. 1 and the coating liquid L described above. As the receiving member (a liquid receiving member in Table 1) installed in the container 14 of the coating device 10, the receiving member 18 shown in FIG. 1 is used. The angle of the inclined surface 18A of the receiving member 18 with respect to the vertical direction is set to 45°.

The inner diameter of the annular body 32 of the coating device 10 is 85.0 mm. The coating liquid L is constantly circulated and supplied to the coating liquid holding part 12 at 0.4 L/min and to the cylindrical body 100 below the upper opening portion 25 at 0.4 L/min. While constantly circulating and supplying the coating liquid L under such conditions, the upper portion of the inner surface of the cylindrical body 100 is gripped by a grip portion (not shown) and the cylindrical body 100 is lowered from the upper side in the vertical direction. At this time, the cylindrical body 100 is caused to penetrate the upper opening portion 25 provided in the coating liquid holding part 12 at a constant speed of 500 mm/min from the upper side in the vertical direction toward the lower side. Until the cylindrical body 100 reaches the lowest point, the coating liquid L filled the coating liquid holding part 12 and is in an overflow state.

Next, the cylindrical body 100 is pulled up at a constant speed of 150 mm/min to form the coated film 102 by the coating liquid L on the outer peripheral surface 100A of the cylindrical body 100. During moving up and down of the cylindrical body 100 through the upper opening portion 25, the coating liquid L discharged from the slit-shaped discharge portion 36 provided in the upper opening portion is applied to the entire periphery of the outer peripheral surface 100A of the cylindrical body 100 below the upper opening portion 25, and the coating liquid L flowed down from the outer peripheral surface 100A of the cylindrical body 100 due to gravity. A sample in which the coating liquid L is applied to the cylindrical body 100 (the coated film 102 is formed on the outer peripheral surface 100A of the cylindrical body 100) is dried with hot air at 135° C. for 40 minutes.

The bubble defects in the coated film 102 of the cylindrical body 100, which is an evaluation item, are observed with a microscope image, and decided based on the criteria of A to C below according to the number of bubble defects having a size of 100 μm or larger per piece.

A: No bubble defect occurs.

B: Two or less bubble defects occur.

C: Three or more bubble defects occur.

Examples 2 to 5

Application of the coating liquid L is performed while changing the angle of the inclined surface 18A of the receiving member 18 (the liquid receiving member) with respect to the vertical direction, as in Examples 2 to 5 shown in Table 1.

Comparative Examples 1 to 3

Application of the coating liquid L is performed while changing the angle of the inclined surface 18A of the receiving member 18 (the liquid receiving member) with respect to the vertical direction, as in Comparative Examples 1 and 2 shown in Table 1. Further, in Comparative Example 3, application of the coating liquid L is performed without providing a receiving member in the container 14. The results of evaluating the occurrence status of bubble defects in the coated film 102 of the cylindrical body 100 are shown in Table 1.

TABLE 1

| | Angle of inclined surface of liquid receiving member with respect to vertical direction | Bubble defects |
|---|---|---|
| Example 1 | 10 | B |
| Example 2 | 15 | A |
| Example 3 | 30 | A |
| Example 4 | 45 | A |
| Example 5 | 60 | B |
| Comparative Example 1 | 5 | C |
| Comparative Example 2 | 75 | C |
| Comparative Example 3 | Without liquid receiving member | C |

As shown in Table 1, in Examples 2 to 4, it is confirmed that no bubble defect occurred in the coated film 102 of the cylindrical body 100. Further, in Examples 1 and 5, it is confirmed that the number of bubble defects occurred in the coated film 102 of the cylindrical body 100 is two or less.

In contrast, in Comparative Examples 1 to 3, it is confirmed that the number of bubble defects occurred in the coated film 102 of the cylindrical body 100 is three or more. In Comparative Example 2, since the angle of the inclined surface of the receiving member 18 with respect to the vertical direction is large (the inclination of the inclined surface with respect to the horizontal direction is gentle), it is considered that foaming is generated due to the impact when the falling coating liquid L collides with the receiving member. On the other hand, in a case where the angle of the inclined surface of the receiving member 18 with respect to the vertical direction is small (the inclination of the inclined surface with respect to the horizontal direction is steep) as in Comparative Example 1, since the falling coating liquid L merges with the liquid level without being sufficiently decelerated, it is considered that foaming cannot be sufficiently prevented.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments are chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A coating device comprising:

a housing having a tubular shape;

a coating liquid holder that is provided with an upper opening portion and a lower opening and said coating liquid holder holds a coating liquid, and in which a cylindrical body penetrates the upper opening and the lower opening, and the cylindrical body is relatively moved to an upper side of said coating liquid holder in an up-down direction, so that the coating liquid is applied to an outer peripheral surface of the cylindrical body; said coating liquid holder is supported on an upper portion in a vertical direction of the housing;

a container is provided at lower portion in the vertical direction of the housing; said container accommodates the coating liquid that flows down along the outer peripheral surface of the cylindrical body;

a circulation part comprising a supply pipe and a pump, that circulates the coating liquid in the container to the coating liquid holder; the container includes a cylindrical portion and a recess portion; the coating liquid in the container having a liquid level; and a receiving member is provided in the container, said receiving member comprising an inclined surface inclined in a direction towards the upper opening and the lower opening of the coating liquid holder, wherein the receiving member is disposed in the container above the liquid level of the coating liquid in the container and said receiving member is spaced apart from the cylindrical body in the vertical direction, and the inclined surface of said receiving member located above the liquid level of the coating liquid in the container receives the coating liquid flowing downward along the outer peripheral surface of the cylindrical body and the coating liquid flows down along the inclined surface, so that the coating liquid is collected in the container merging with the liquid level of the coating liquid in the container; a width of the receiving member in a direction orthogonal to an axial direction of the receiving member is larger than the outer diameter of the cylindrical body.

2. The coating device according to claim 1, wherein the inclined surface has a flat plate shape or a straight line shape in a case of being viewed from a direction orthogonal to an axial direction of the coating liquid holder, and an angle of the inclined surface with respect to the vertical direction is greater than or equal to 10° and less than or equal to 60°.

3. The coating device according to claim 2, wherein the angle of the inclined surface with respect to the vertical direction is greater than or equal to 15° or larger and less than or equal to 45°.

4. The coating device according to claim 2, wherein the inclined surface is inclined to have a downward slope in one direction intersecting the vertical direction.

5. The coating device according to claim 1, wherein the inclined surface is a curved surface, and an angle between a tangent surface at an intersection point of the curved surface with an extension line extending downward along the outer peripheral surface of the cylindrical body and the vertical direction is greater than or equal to 10° or larger and less than or equal to 60°.

6. The coating device according to claim 5, wherein the angle between the tangent surface at the intersection point of the curved surface with the extension line extending downward along the outer peripheral surface of the cylindrical body and the vertical direction is greater than or equal to 15° and less than or equal to 45°.

7. The coating device according to claim 6, wherein the inclined surface is inclined to have a downward slope in one direction intersecting the vertical direction.

8. The coating device according to claim 2, wherein the inclined surface has a conical shape whose central portion protrudes in a case of being viewed in a side view.

9. The coating device according to claim 3, wherein the inclined surface has a conical shape whose central portion protrudes in a case of being viewed in a side view.

10. The coating device according to claim 1, wherein the inclined surface is a curved surface portion whose central portion protrudes in a mountain shape in a case of being viewed in a side view.

11. The coating device according to claim 10, wherein an angle between a tangent surface at an intersection point of the inclined surface with an extension line extending downward along the outer peripheral surface of the cylindrical body and the vertical direction is greater than or equal to 10° and less than or equal to 60°.

12. A coating method of applying a coating liquid by using a coating device comprising:

a housing having a tubular shape;

a coating liquid holder that is provided with an upper opening and a lower opening and said coating liquid holder holds a coating liquid, and in which a cylindrical body penetrates the upper opening and the lower opening, and the cylindrical body is relatively moved to an upper side of said coating liquid holder in an up-down direction, so that the coating liquid is applied to an outer peripheral surface of the cylindrical body; said coating liquid holder is supported on an upper portion in a vertical direction of the housing;

a container is provided at a lower portion in the vertical direction of the housing; said container accommodates the coating liquid that flows down along the outer peripheral surface of the cylindrical body; a circulation part comprising a supply pipe and a pump, that circulates the coating liquid in the container to the coating liquid holder; the container includes a cylindrical portion and a recess portion; the coating liquid in the container having a liquid level;

and a receiving member is provided in the container, said receiving member comprising an inclined surface inclined in a direction towards the upper opening and the lower opening of the coating liquid holder, wherein the receiving member is disposed in the container above the liquid level of the coating liquid in the container and said receiving member is spaced apart from the cylindrical body in the vertical direction, and the inclined surface of said receiving member located above the liquid level of the coating liquid in the container receives the coating liquid flowing downward along the outer peripheral surface of the cylindrical body and the coating liquid flows down along the inclined surface, so that the coating liquid is collected in the container merging with the liquid level of the coating liquid in the container; a width of the receiving member in a direction orthogonal to an axial direction of the receiving member is larger than the outer diameter of the cylindrical body;

the coating method comprising:

moving the cylindrical body upward in the up-down direction relative to the coating liquid holder of the coating device and applying the coating liquid from the coating liquid holder to the outer peripheral surface of the cylindrical body;

receiving the coating liquid flowing downward along the outer peripheral surface of the cylindrical body with the inclined surface of the receiving member above the liquid level of the coating liquid in the container and accommodating the coating liquid in the container; and circulating the coating liquid in the container to the coating liquid holder by the circulation part.

13. The coating method according to claim 12, wherein the cylindrical body is a cylindrical member or a member obtained by winding an endless belt-shaped member around a cylindrical core material.

14. A method for manufacturing a photoconductor comprising using the coating method according to claim 12, wherein the cylindrical body is a cylindrical member made of metal or a member obtained by winding an endless belt-shaped member made of metal around a cylindrical core material, and the coating liquid contains a photosensitive material.

15. The coating method according to claim 12, wherein the inclined surface has a flat plate shape or a straight line shape in a case of being viewed from a direction orthogonal to an axial direction of the coating liquid holder, and an angle of the inclined surface with respect to the vertical direction is greater than or equal to 10° and less than or equal to 60°.

16. The coating method according to claim 15, wherein the angle of the inclined surface with respect to the vertical direction is greater than or equal to 15° and less than or equal to 45°.

17. The coating method according to claim 12, wherein the inclined surface is a curved surface, and an angle between a tangent surface at an intersection point of the curved surface with an extension line extending downward along the outer peripheral surface of the cylindrical body and the vertical direction is greater than or equal to 10° and less than or equal to 60°.

18. The coating method according to claim 17, wherein the angle between the tangent surface at the intersection point of the curved surface with the extension line extending downward along an outer peripheral surface of the cylindrical body and the vertical direction is greater than or equal to 15° and less than or equal to 45°.

* * * * *